(12) United States Patent
Mun et al.

(10) Patent No.: US 10,297,672 B2
(45) Date of Patent: May 21, 2019

(54) TRIPLE GATE TECHNOLOGY FOR 14 NANOMETER AND ONWARDS

(71) Applicant: GLOBALFOUNDRIES Inc., Grand Cayman (KY)

(72) Inventors: Seong Yeol Mun, Cohoes, NY (US); Kwan-Yong Lim, Niskayuna, NY (US); Kijik Lee, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/649,227

(22) Filed: Jul. 13, 2017

(65) Prior Publication Data

US 2019/0019880 A1    Jan. 17, 2019

(51) Int. Cl.
| | |
|---|---|
| *H01L 29/66* | (2006.01) |
| *H01L 29/78* | (2006.01) |
| *H01L 29/51* | (2006.01) |
| *H01L 27/088* | (2006.01) |
| *H01L 21/28* | (2006.01) |
| *H01L 21/02* | (2006.01) |
| *H01L 29/49* | (2006.01) |

(52) U.S. Cl.
CPC .. *H01L 29/66484* (2013.01); *H01L 21/02068* (2013.01); *H01L 21/28088* (2013.01); *H01L 21/28185* (2013.01); *H01L 29/4966* (2013.01); *H01L 29/517* (2013.01); *H01L 29/7831* (2013.01)

(58) Field of Classification Search
CPC .............. H01L 21/28; H01L 21/02068; H01L 21/28088; H01L 21/28185; H01L 29/66; H01L 29/78; H01L 29/66484; H01L 29/4966; H01L 29/51; H01L 29/517; H01L 29/7831; H01L 27/088
See application file for complete search history.

(56) References Cited

U.S. PATENT DOCUMENTS

| | | | |
|---|---|---|---|
| 8,222,680 B2 | 7/2012 | Lin et al. | |
| 2016/0197018 A1* | 7/2016 | Andrieu | H01L 21/84 438/155 |
| 2017/0221764 A1* | 8/2017 | Kim | H01L 21/82345 |
| 2017/0301551 A1* | 10/2017 | Kang | H01L 21/3085 |

* cited by examiner

*Primary Examiner* — Fazli Erdem
(74) *Attorney, Agent, or Firm* — Ditthavong & Steiner, P.C.

(57) ABSTRACT

A method of forming a 14 nm triple gate by adding a MG in the dual gate process and the resulting device are provided. Embodiments include forming an EG region, a MG region and a SG region in a first, second and third portions of a Si substrate, respectively; forming an IL over the EG, MG and SG regions; oxidizing the IL; forming a HK dielectric layer over the IL; performing PDA on the HK dielectric layer; forming a PSA TiN layer over the HK dielectric layer; forming an a-Si cap layer over the PSA TiN layer; forming a photoresist over the a-Si cap layer in the EG and SG regions; removing the a-Si cap layer in the MG region, exposing the PSA TiN layer; stripping the photoresist; and annealing the a-Si cap and PSA TiN layers.

13 Claims, 6 Drawing Sheets

TRIPLE GATE TECHNOLOGY FOR 14 NANOMETER AND ONWARDS

TECHNICAL FIELD

The present disclosure relates to the manufacture of semiconductor devices, such as integrated circuits (ICs). The present disclosure is particularly applicable to the fin field-effect transistor (FINFET) based 14 nanometer (nm) technology node and beyond.

BACKGROUND

Currently, only a dual gate is available at the 14 nm technology node. The dual gate includes a single gate (SG) (logic) operating at a high voltage (V), e.g., Vmax of 0.945 V, and an extended gate (EG) input/output (I/O) operating at a voltage ($V_{DD}$) of 1.2 V for a gate channel with a length of 100 nm. The existing 14 nm technology cannot meet consumer demands for higher $V_{DD}$ application because a SG with higher $V_{DD}$ runs a risk of time dependent dielectric breakdown (TDDB) or bias temperature instability (BTI) margin. In addition, an EG with higher $V_{DD}$ application has a lower speed due to a thick gate dielectric thickness (TOX).

Current 14 nm technology does not offer a triple gate due to process challenges. The process challenges for forming a triple gate in a 14 nm technology are illustrated in FIGS. 1 through 3. Adverting to FIG. 1, an EG 101, a MG 103 and a SG 105 are formed in a silicon (Si) substrate 107. An interfacial layer (IL) 109 is conformally formed over the Si substrate 107. As illustrated in FIG. 2, a photoresist 201 is formed over the IL 109 over the EG 101. Then, the IL 109 over the MG 103 and SG 105 are etched, thereby forming IL 109'. The photoresist 201 is then stripped (not shown for illustrative convenience) followed by a clean process, e.g., standard clean 1 (SC1). Next, the IL 109' over the MG 103 is oxidized (not shown for illustrative convenience). The process steps in FIG. 3 are similar to the process steps of FIG. 2. Adverting to FIG. 3, a photoresist 301 is formed over the ILs 109 and 109' over the EG 101 and MG 103. Then, the IL 109' over the SG 105 is etched, thereby forming IL 109''. The photoresist 301 is then stripped (not shown for illustrative convenience) followed by SC1. Next, the IL 109'' over SG 105 is oxidized (not shown for illustrative convenience). These multiple process steps of lithography, etching and oxidation to form a triple gate adds to process complexity.

A need therefore exists for methodology enabling a middle gate (MG) in the dual gate process for forming a triple gate with simpler process steps.

SUMMARY

An aspect of the present disclosure is forming a 14 nm triple gate by adding a MG in the dual gate process.

Another aspect of the present disclosure is a 14 nm technology node triple gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an EG region, a MG region and a SG region in a first, second and third portions of a Si substrate, respectively; forming an IL over the EG, MG and SG regions; oxidizing the IL; forming a high-K (HK) dielectric layer over the IL; performing post dielectric annealing (PDA) on the HK dielectric layer; forming a post Si anneal titanium nitride (PSA TiN) layer over the HK dielectric layer; forming an amorphous silicon (a-Si) cap layer over the PSA TiN layer; forming a photoresist over the a-Si cap layer in the EG and SG regions; removing the a-Si cap layer in the MG region, exposing the PSA TiN layer; stripping the photoresist; and annealing the a-Si cap and PSA TiN layers.

Aspects of the present disclosure include performing a laser spike annealing (LSA) on the a-Si cap layer in the EG and SG regions and the exposed PSA TiN layer subsequent to the annealing; removing the a-Si cap layer over the EG and SG regions; and removing the PSA TiN layer. Another aspect includes removing the a-Si cap layer in the MG region by wet etching. Further aspects include the wet etching including a SC1 solution containing ammonia solution ($NH_4OH$). Additional aspects include the IL including silicon dioxide ($SiO_2$). Another aspect includes forming the IL in the EG region thicker than the IL in the MG and SG regions. Further aspects include the HK dielectric layer including hafnium dioxide ($HfO_2$). Additional aspects include forming the HK dielectric layer to a thickness of 36 angstrom (Å). Another aspect includes annealing the a-Si cap at a temperature of 950° C. Further aspects include removing the a-Si cap layer by hydrofluoric acid (200:1)/SC1/$NH_4OH$.

Another aspect of the present disclosure is a device including: an EG region, a MG region and a SG region in a first, second and third portions of a Si substrate, respectively; an IL over the EG, MG and SG regions; a HK dielectric layer over the IL; a PSA TiN layer over the HK dielectric layer; and an a-Si cap layer over the PSA TiN layer in the EG and SG regions.

Aspects of the device include the IL including $SiO_2$. Another aspect includes the IL having a thickness of 34 Å in the EG region, 22 Å in the MG region and 10 Å in the SG region. Other aspects include the HK dielectric layer including a $HfO_2$. A further aspect includes the HK dielectric layer having a thickness of 36 Å in the EG, MG and SG regions. Another aspect includes the PSA TiN layer having a thickness of 19.5 Å in the EG, MG and SG regions. Other aspects include wherein the EG region is lengthier and thicker than the MG and SG regions.

A further of the present disclosure is a method including: forming an EG region operating with 1.8 V, a MG region operating with 1.2 V and a SG region operating with 0.8 V in a first, second and third portions of a Si substrate, respectively; forming an IL of $SiO_2$ over the EG, MG and SG regions; oxidizing the IL; forming a HK dielectric layer of $HfO_2$ to a thickness of 36 Å over the IL; performing a PDA on the HK dielectric layer; forming a PSA TiN layer over the HK dielectric layer; forming an a-Si cap layer over the PSA TiN layer; forming a photoresist over the a-Si cap layer in the EG and SG regions; removing the a-Si cap layer in the MG region by wet etching, exposing the PSA TiN layer; stripping the photoresist; and annealing the a-Si cap layer in the EG and SG regions and the exposed PSA TiN layer at a temperature of 950° C.

Aspects of the present disclosure include the wet etching includes a SC1 solution containing $NH_4OH$. Another aspect includes forming the IL in the EG region with a greater thickness than the IL in the MG and SG regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of difficulty in providing higher $V_{DD}$ application and process challenges for forming a triple gate attendant upon adding a MG in the dual gate process for forming a triple gate. The problems are solved, inter alia, by performing lithography, etching and annealing after a conventional dual gate process sequence.

Methodology in accordance with embodiments of the present disclosure includes forming an EG region, a MG region and a SG region in a first, second and third portions of a Si substrate, respectively. An IL is formed over the EG, MG and SG regions, and is oxidized. A HK dielectric layer is formed over the IL, and PDA is performed on the HK dielectric layer. A PSA TiN layer is formed over the HK dielectric layer. An a-Si cap layer is formed over the PSA TiN layer. A photoresist is formed over the a-Si cap layer in the EG and SG regions, and the a-Si cap layer in the MG region is removed exposing the PSA TiN layer. The photoresist is stripped and the a-Si cap and PSA TiN layers are annealed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

Figure 1:
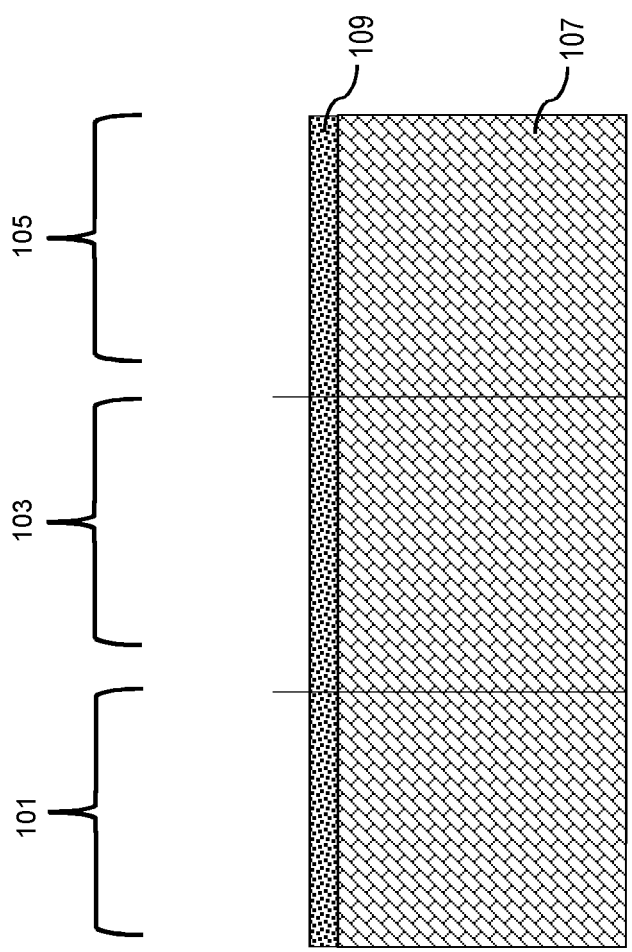
FIGS. 1 through 3 schematically illustrate process challenges for forming a triple gate in the 14 nm technology node.
Figure 2:
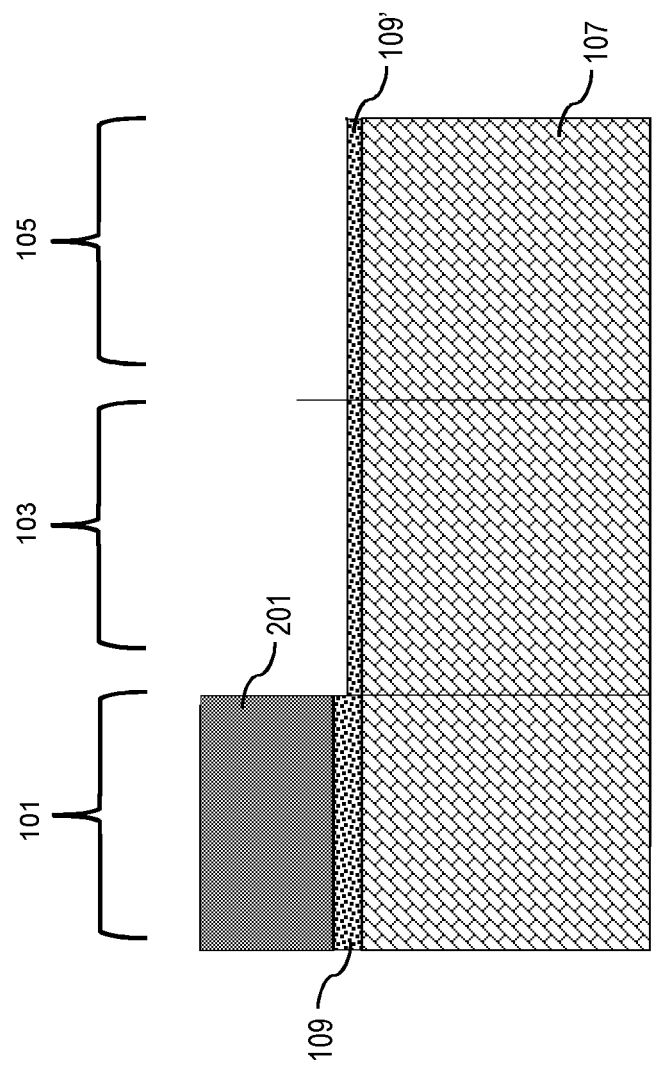
Figure 3:
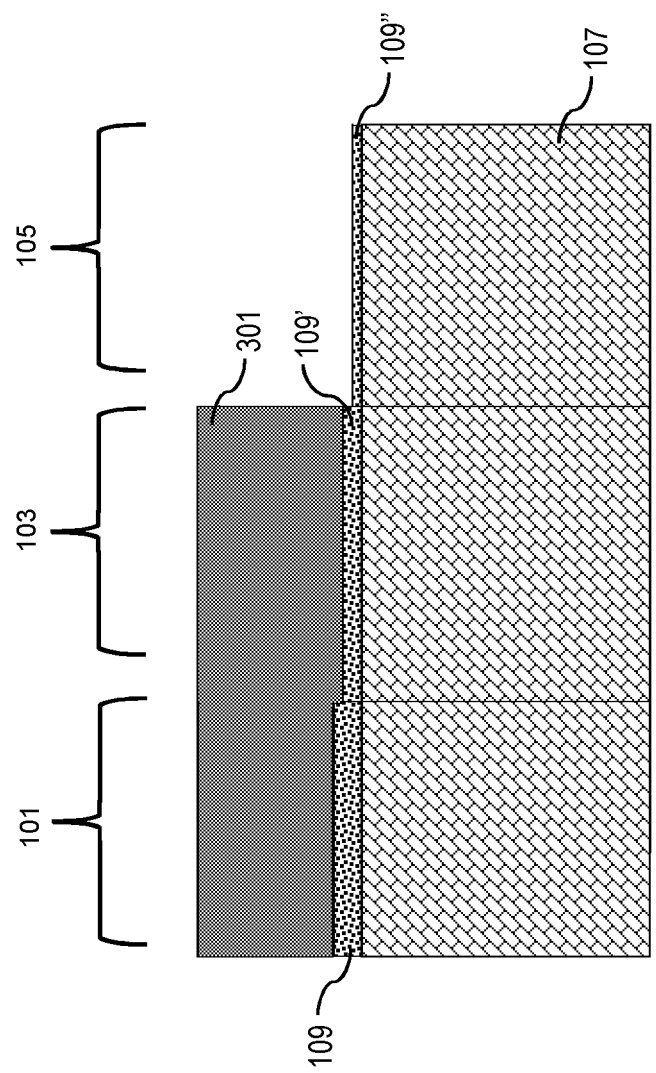
Figure 4:
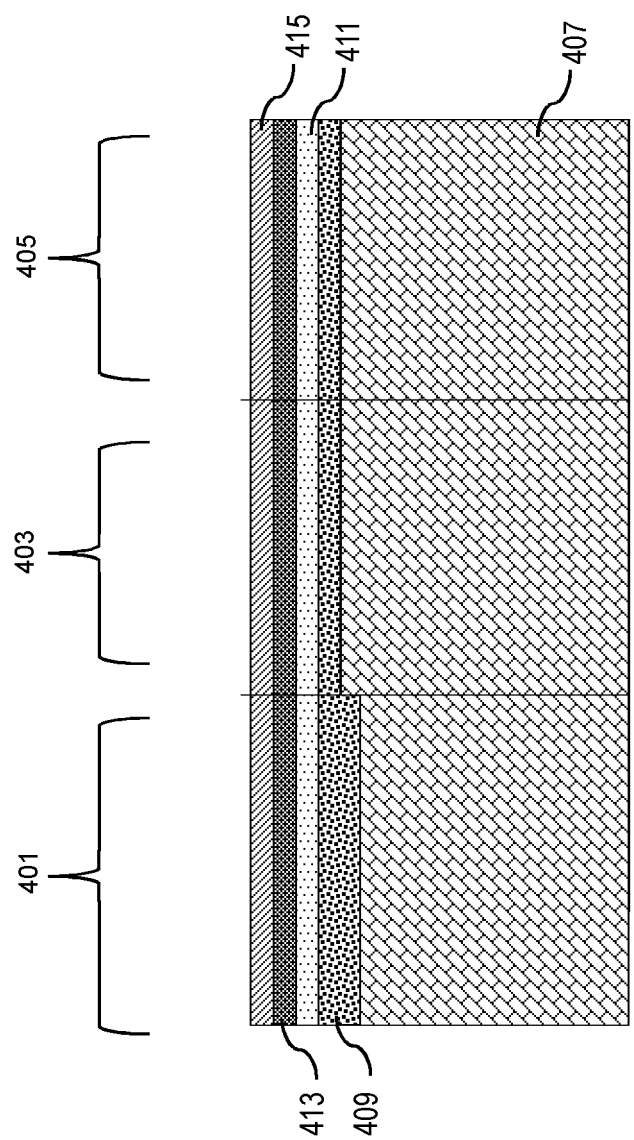
FIG. 4 through 6 schematically illustrates cross-sectional views of a process flow for forming a 14 nm triple gate by adding a MG in the dual gate process, in accordance with an exemplary embodiment.
Figure 5:
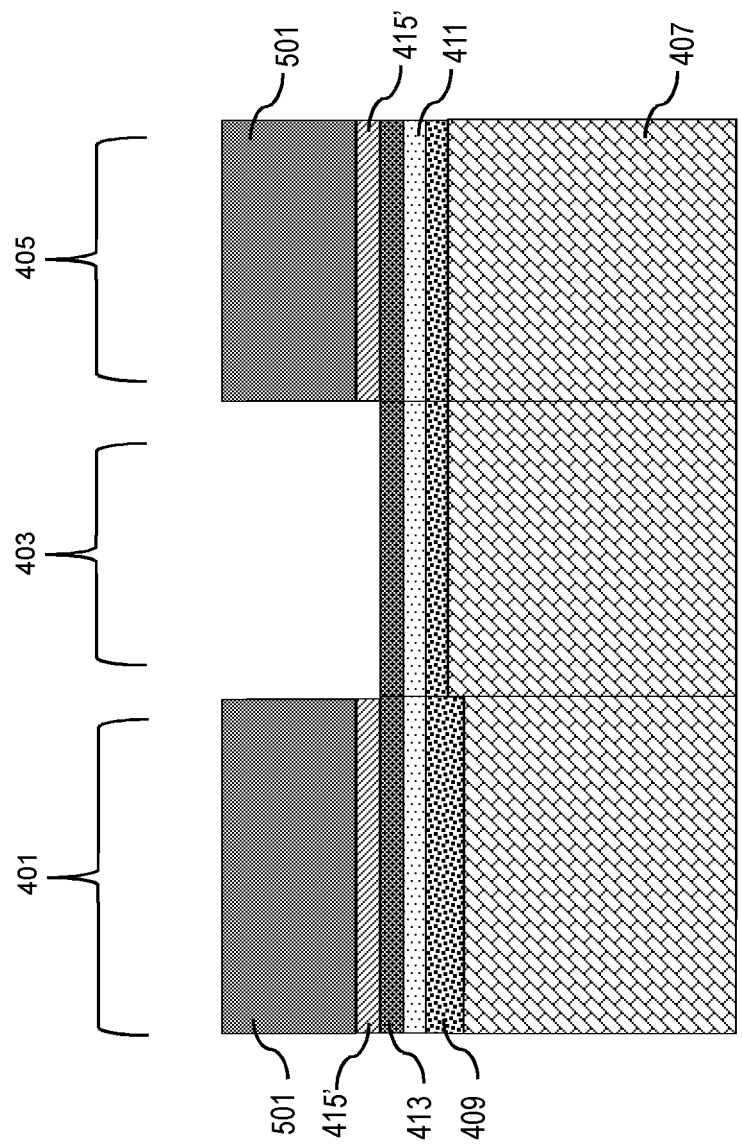
Figure 6:
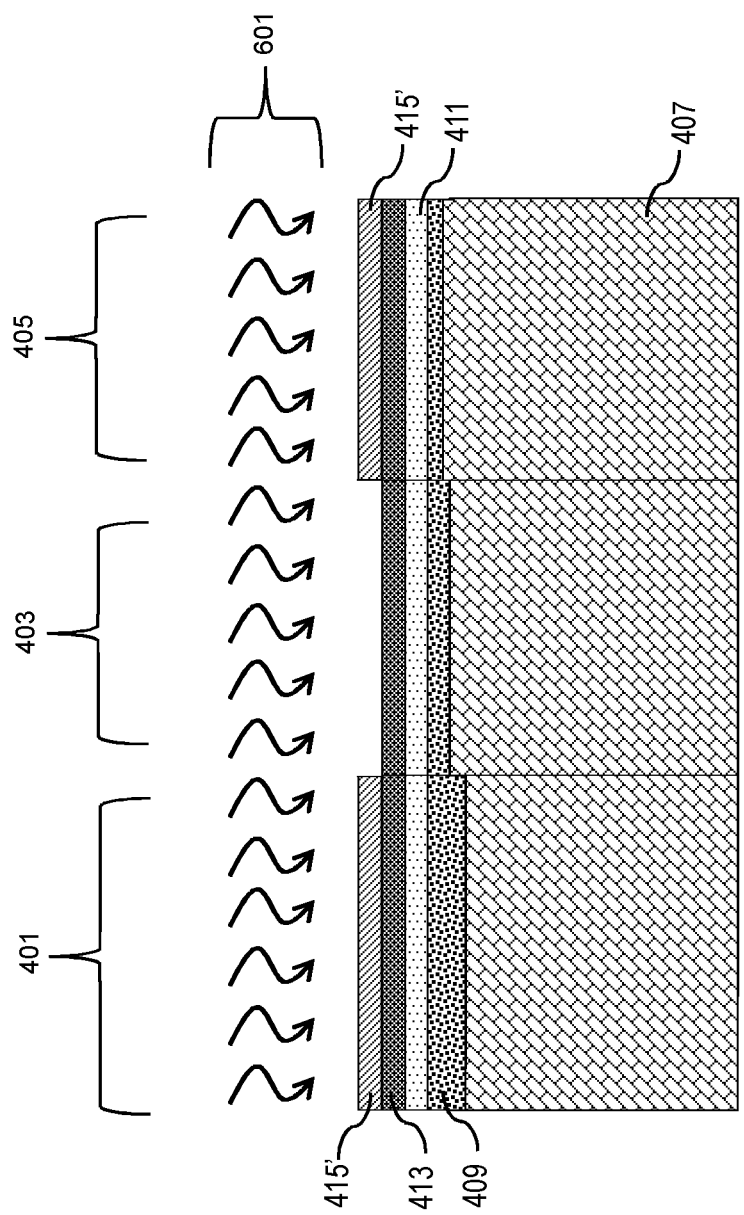

FIG. 4 through 6 schematically illustrate cross-sectional views of a process flow for forming a 14 nm triple gate by adding a MG in the dual gate process, in accordance with an exemplary embodiment. Adverting to FIG. 4, an EG 401 operating at a V, e.g., of 1.8 V, a MG 403 operating at a V, e.g., of 1.2 V and a SG 405 operating at a V, e.g., of 0.8 V are respectively formed in a first, second and third portions of a Si substrate 407. The EG 401 has a minimum gate length, e.g., of 100 nm for 1.5 V/1.2 V and 150 nm for 1.8 V, and has a TOX, e.g., of 44 Å. The MG 403 has a minimum gate length, e.g., of 30 nm (this length is greater than the length of SG 405 against hot carrier injection (HCI) margin, but much smaller compared to the EG 401), and has a TOX, e.g., of 32 Å. The SG 405 has a minimum gate length, e.g., of 14 nm with a TOX, e.g., of 20 Å. The IL 409 is formed, e.g., of $SiO_2$, over the EG 401, MG 403 and SG 405. The IL 409 is notably thicker in the EG 401 than in the MG 403 and SG 405. The IL 409 in the EG 401 is formed, e.g., to a thickness of 34 Å, and the IL 409 in the MG 403 and SG 405 is formed, e.g., to a thickness of 10 Å. Then, the IL 409 is oxidized. Next, a HK dielectric layer 411 is formed, e.g., of $HfO_2$, over the IL 409. The HK dielectric layer 411 may be formed, e.g., to a thickness of 36 Å. A PDA is performed on the HK dielectric layer 411 for gate dielectric formation. A PSA TiN layer 413 is then formed, e.g., to a thickness of 19.5 Å, over the HK dielectric layer 411. Thereafter, an a-Si cap layer 415 is formed over the PSA TiN layer 413.

As illustrated in FIG. 5, a photoresist 501 is formed over the a-Si cap layer 415 in the EG 401 and SG 405. Then, the a-Si cap layer 415 in the MG 403 is removed by wet etching. The wet etching is performed at a room temperature to open the MG 403, thereby exposing the PSA TiN layer 413 in the MG 403. The wet etching includes a SC1 containing $NH_4OH$, as $NH_4OH$ has a negligible impact on the PSA TiN layer 413 and photoresist 501. Adverting to FIG. 6, the photoresist 501 is stripped, and is followed by a cleaning process (not shown for illustrative convenience). Then, the remaining a-Si cap layer 415' and the exposed PSA TiN layer 413 in MG 403 are annealed, e.g., at a temperature of 950° C., as depicted by the lines 601. The a-Si cap layer 415 on SG 405 has an accumulation capacitance (Cacc), e.g., of 290 picofarad (pF), and the PSA anneal without an a-Si Cap layer on MG 403 has a Cacc of, e.g., 180 pF. The MG 403 without a-Si CAP layer has a thicker, e.g., 1.6 times thicker, IL 409 ($SiO_2$)/dielectric layer 411 ($HfO_2$). The PSA anneal makes the IL 409 grow faster, e.g., by 1.6 times, in the MG 403 than in the SG 405. A LSA is performed (not shown for illustrative convenience) on the a-Si cap layer 415' and a spike anneal is performed (not shown for illustrative convenience) on the exposed PSA TiN layer 413 in the MG 403 to cure interface trapped charges (Qit) between the interface of the IL 409 and HK dielectric layer 411 with minimal IL regrowth. Subsequently, the a-Si cap layer 415 is removed by hydrofluoric acid (200:1)/SC1/$NH_4OH$ and the PSA TiN layer 413 is removed as well (both not shown for illustrative convenience).

The embodiments of the present disclosure can achieve several technical effects, including improved performance; higher $V_{DD}$ operation with safer reliability; increased gate dielectric thickness with improved breakdown voltage (VBD). Further, by eliminating multiple steps of lithography, etching and oxidation, the triple gate process becomes simpler, and process costs are reduced. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of types of highly integrated FINFET semiconductor devices, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an extended gate (EG) region, a middle gate (MG) region and a single gate (SG) region in a first, second and third portions of a silicon (Si) substrate, respectively;
    forming an interfacial layer (IL) over the EG, MG and SG regions;
    oxidizing the IL;
    forming a high-K (HK) dielectric layer over the IL;
    performing post dielectric annealing (PDA) on the HK dielectric layer;
    forming a post Si anneal titanium nitride (PSA TiN) layer over the HK dielectric layer;
    forming an amorphous silicon (a-Si) cap layer over the PSA TiN layer;
    forming a photoresist over the a-Si cap layer in the EG and SG regions;
    removing the a-Si cap layer in the MG region, exposing the PSA TiN layer;
    stripping the photoresist; and
    annealing the a-Si cap and PSA TiN layers.

2. The method according to claim 1, further comprising:
    performing a laser spike annealing (LSA) on the a-Si cap layer in the EG and SG regions and the exposed PSA TiN layer subsequent to the annealing;
    removing the a-Si cap layer over the EG and SG regions; and
    removing the PSA TiN layer.

3. The method according to claim 1, comprising removing the a-Si cap layer in the MG region by wet etching.

4. The method according to claim 3, wherein the wet etching comprises a standard clean 1 (SC1) solution containing ammonia solution (NH$_4$OH).

5. The method according to claim 1, wherein the IL comprises silicon dioxide (SiO$_2$).

6. The method according to claim 1, comprising forming the IL in the EG region thicker than the IL in the MG and SG regions.

7. The method according to claim 1, wherein the HK dielectric layer comprises hafnium dioxide (HfO$_2$).

8. The method according to claim 1, comprising forming the HK dielectric layer to a thickness of 36 angstroms (Å).

9. The method according to claim 1, comprising annealing the a-Si cap at a temperature of 950° C.

10. The method according to claim 2, comprising removing the a-Si cap layer by hydrofluoric acid (200:1)/standard clean 1 (SC1)/ ammonia solution (NH$_4$OH).

11. A method comprising:
    forming an extended gate (EG) region operating with 1.8 voltage (V), a middle gate (MG) region operating with 1.2 V and a single gate (SG) region operating with 0.8 V in a first, second and third portions of a silicon (Si) substrate, respectively;
    forming an interfacial layer (IL) of silicon dioxide (SiO$_2$) over the EG, MG and SG regions;
    oxidizing the IL;
    forming a high-K (HK) dielectric layer of hafnium dioxide (HfO$_2$) to a thickness of 36 Å over the IL;
    performing a post dielectric annealing (PDA) on the HK dielectric layer;
    forming a post Si anneal titanium nitride (PSA TiN) layer over the HK dielectric layer;
    forming an amorphous silicon (a-Si) cap layer over the PSA TiN layer;
    forming a photoresist over the a-Si cap layer in the EG and SG regions;
    removing the a-Si cap layer in the MG region by wet etching, exposing the PSA TiN layer;
    stripping the photoresist; and
    annealing the a-Si cap layer in the EG and SG regions and the exposed PSA TiN layer at a temperature of 950° C.

12. The method according to claim 11, wherein the wet etching comprises a standard clean 1 (SC1) solution containing ammonia solution (NH$_4$OH).

13. The method according to claim 11, comprising forming the IL in the EG region with a greater thickness than the IL in the MG and SG regions.

* * * * *